(12) United States Patent
Moser

(10) Patent No.: US 6,549,156 B1
(45) Date of Patent: Apr. 15, 2003

(54) METHOD OF FORMING A SEMICONDUCTOR DEVICE AND STRUCTURE THEREFOR

(75) Inventor: Jay Moser, Hope, RI (US)

(73) Assignee: Semiconductor Components Industries LLC, Phoenix, AZ (US)

(*) Notice: Subject to any disclaimer, the term of this patent is extended or adjusted under 35 U.S.C. 154(b) by 0 days.

(21) Appl. No.: 10/122,169

(22) Filed: Apr. 15, 2002

(51) Int. Cl.[7] .................... H03M 1/10; H03M 1/66
(52) U.S. Cl. ............................ 341/144; 341/120
(58) Field of Search ........................... 341/144, 154, 341/118, 120; 702/107; 205/775; 327/350; 330/2

(56) References Cited

U.S. PATENT DOCUMENTS

| 4,222,107 A | * | 9/1980 | Mrozowski et al. ........ 702/107 |
| 5,087,914 A | * | 2/1992 | Sooch et al. ................ 341/120 |
| 6,316,992 B1 | * | 11/2001 | Miao et al. ..................... 330/2 |

OTHER PUBLICATIONS

Semitech, SC1144, Programmable, High Performance Multi-Phase PWM Controller, Revision 1, Jan. 2001, 11 pages.

* cited by examiner

*Primary Examiner*—Patrick Wamsley

(57) ABSTRACT

An electronic system (10) is formed to include a circuit (11) having a digital-to-analog converter (12). Digital-to-analog converter (12) is formed to add an error voltage to the digital-to-analog converter output to adjust or translate the analog output value to include a power return offset value.

20 Claims, 3 Drawing Sheets

METHOD OF FORMING A SEMICONDUCTOR DEVICE AND STRUCTURE THEREFOR

BACKGROUND OF THE INVENTION

The present invention relates, in general, to electronics, and more particularly, to methods of forming semiconductor devices and structure.

In the past, the electronics industry utilized digital-to-analog converters in various electronic systems for many different types of applications. These digital-to-analog converters or DACs were precision circuits that were expected to have a highly precise analog output. Often, other circuits in a system induced various types of offsets that caused the output of the DAC to have errors that exceed the desired DAC tolerances. Two common offsets were ground reference offsets and power supply variations. In order to compensate for the ground reference errors, the ground connections of the receiving circuit and the DAC were physically connected together. Connecting a remote ground to the ground reference input of the DAC still did not achieve the desired precision of no less than 99.9 percent accuracy.

Accordingly, it is desirable to have a method of forming a DAC that reduces induced errors, that reduces ground reference errors, and that reduces the errors internal to the DAC.

BRIEF DESCRIPTION OF THE DRAWINGS

For simplicity and clarity of illustration, elements in the figures are not necessarily to scale, and the same reference numbers in different figures denote the same elements. Additionally, descriptions and details of well known steps and elements are omitted for simplicity of the description.

DETAILED DESCRIPTION OF THE DRAWINGS

The present description includes a method of forming a system having a digital-to-analog converter that has, among other features, reduced error in the output, and that has compensation for ground reference variations between the digital-to-analog converter and other circuits in the system.

Figure 1:
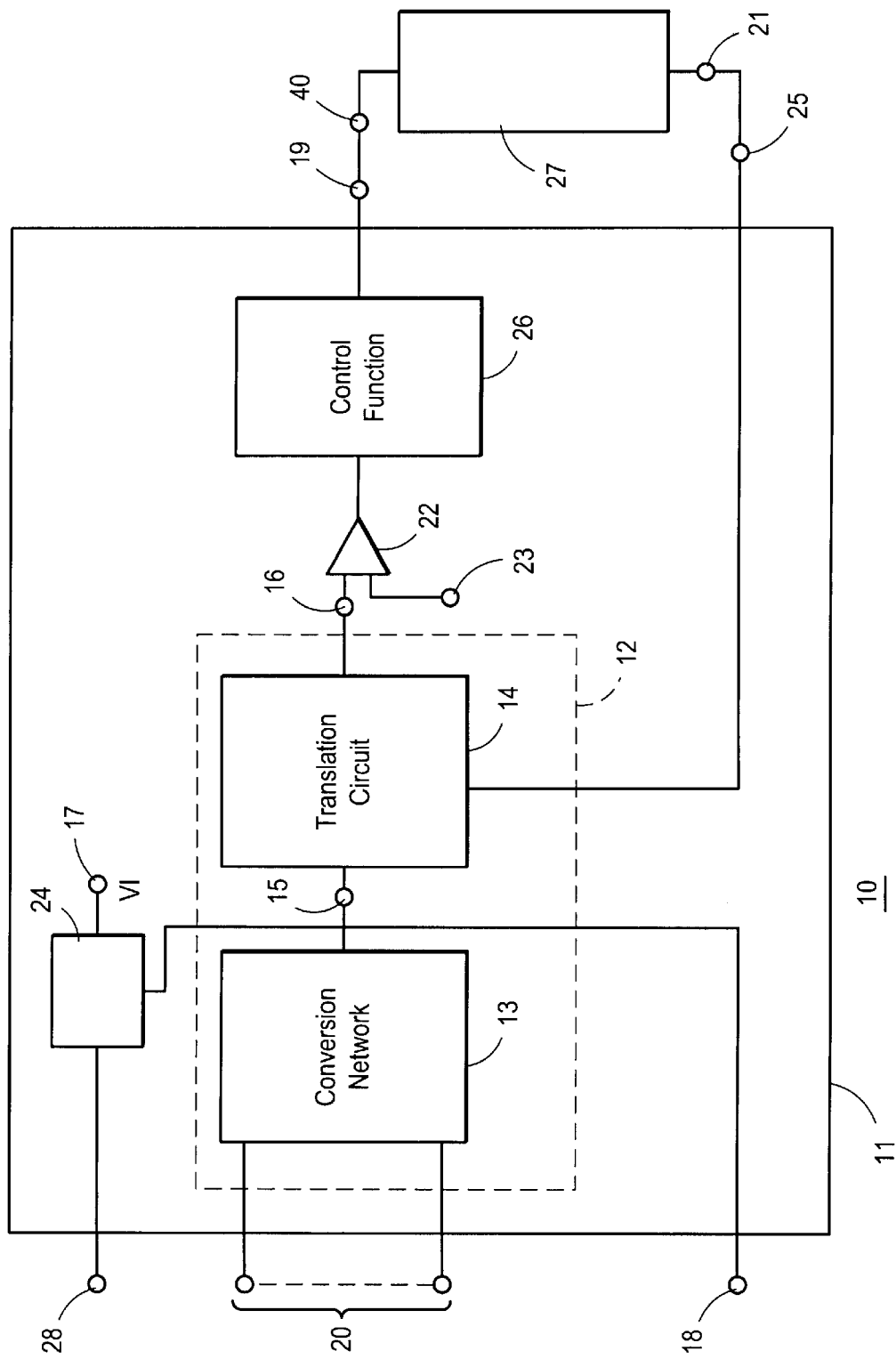
FIG. 1 schematically illustrates an embodiment of a portion of a system having a digital-to-analog converter circuit.

FIG. 1 schematically illustrates an embodiment of a portion of an electronic system 10 having a digital-to-analog converter or DAC 12, generally illustrated by a dashed box, that provides a precision output on a DAC output 16. DAC 12 typically is a portion of a control circuit 11 having an output 19 that is connected to an input 40 of a load or remote circuit 27 such as a microprocessor or other type of load. In one embodiment, DAC 12 is a portion of a switch mode power controller circuit 11 that provides various programmable power supply voltages on output 19. In other embodiments, DAC 12 may be a portion of other circuit functions such as a DC—DC converter circuit, a pulse width modulated controller circuit, a linear regulator or anywhere a precision regulated DAC is desired.

Circuit 11 generally includes DAC 12 along with other circuitry such as control functions 26 and typically includes an error amplifier 22. Error amplifier 22 usually has a reference voltage applied to an input 23 and receives output 16 on another input. Circuit 11 receives power from an external source on a power source input 28. In one embodiment, an internal voltage regulator 24 of circuit 11 receives a voltage on power source input 28 and regulates it to form an internal supply voltage (VI) on an internal supply voltage node or an internal voltage node 17. DAC 12 provides a precision regulated output voltage, thus, voltage regulator 24 provides a precise value for internal supply voltage (VI), preferably a value that has a accuracy of no less than ninety-nine percent (99%). Typically, regulator 24 is a band-gap reference regulator to provide the desired precision. Internal voltage node 17 typically is connected to supply power to the various circuit elements of circuit 11. Circuit 11 includes a power return 18 that functions as a return for the power supplied on external power source input 28 and typically forms a ground reference for circuit 11.

DAC 12 receives a digital input value or digital code on digital inputs 20 and converts the digital code into a corresponding analog voltage on DAC output 16. Digital inputs 20 may vary from one input to any number of digital inputs that present a code representing a digital value to be used by DAC 12. DAC 12 includes a digital-to-analog conversion network 13 and a translation circuit 14, generally illustrated by dashed boxes, that function to assist DAC 12 in forming the analog voltage on DAC output 16.

Remote circuit 27 has a power return or remote return 21 that typically functions as a return for the operating power supplied to circuit 27. Circuit 11 receives the value of remote return 21 on a remote sense input 25. Remote return 21 typically is connected somewhere within system 10 to the same point as power return 18 and most often are connected to a system ground potential of system 10. However, because circuit 11 and circuit 27 may be separated by a distance, the actual potential at power return 21 and power return 18 may be different. Such power return offsets (often referred to as a ground difference or ground offset or delta) and differences in potential are well known to those skilled in the art.

Figure 2:
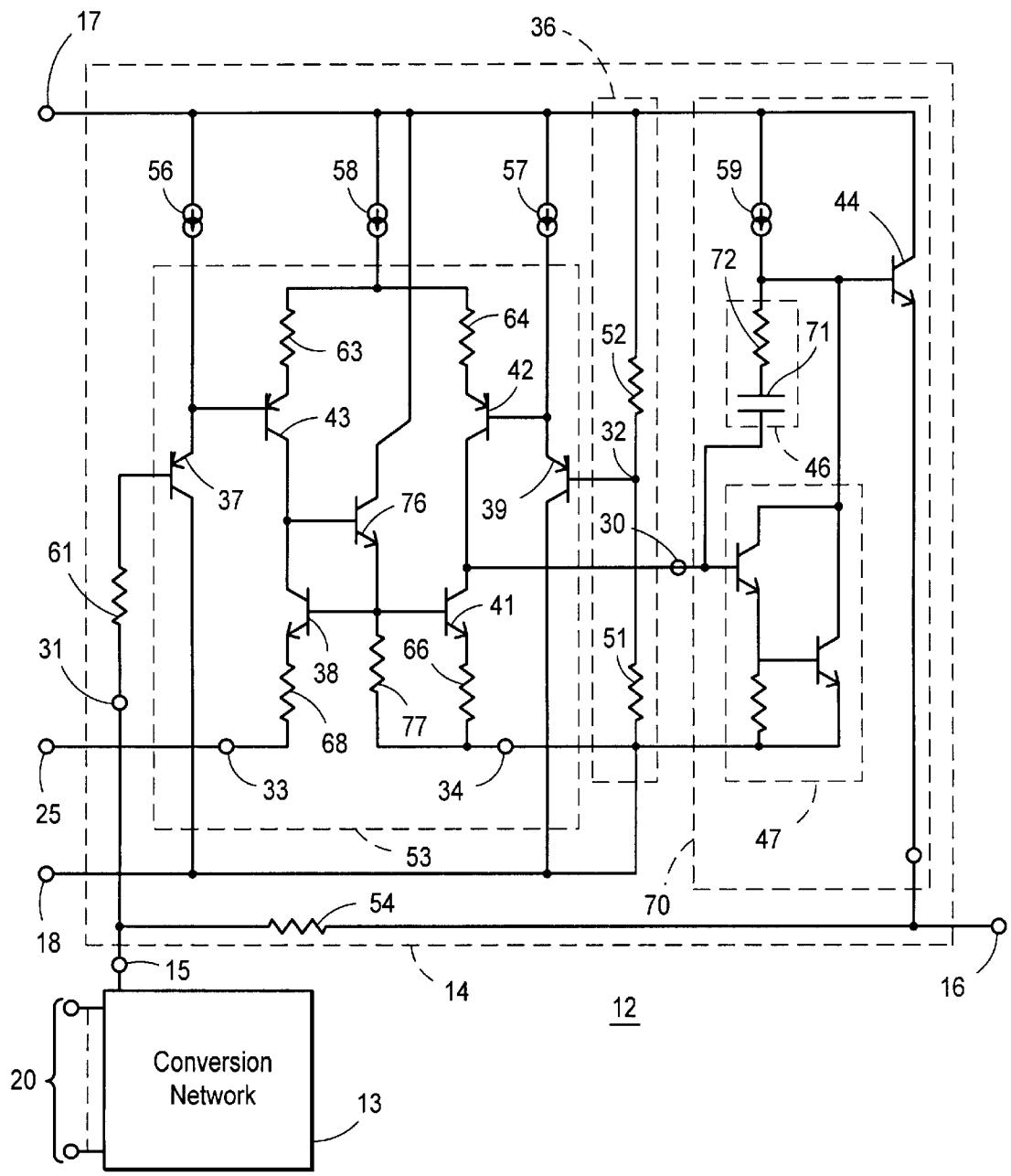
FIG. 2 schematically illustrates an embodiment of a portion of the digital-to-analog converter circuit shown in FIG. 1.

FIG. 2 schematically illustrates an embodiment of a portion of DAC 12. Conversion network 13 is formed to responsively receive the digital code on inputs 20 and form an analog signal representative of the digital code at an output 15 of conversion network 13. In one embodiment, conversion network 13 is a series of current sources formed in a ladder arrangement that selects a different current value for each value presented by digital inputs 20. Such conversion networks are well known to those skilled in the art. The value formed on output 15 is coupled to translation circuit 14 and to a first output or DAC output 16 through a resistor 54. Translation circuit 14 is formed to adjust or translate the value on output 15 from a first value to form a second value that includes variations in the difference between the values of the voltages on power return 18 and remote return 21 or the power return offset value. Translation circuit 14 is formed to receive the first value or the value from output 15 on a first reference input or a reference input 31. A second reference input or a voltage reference input 32 of translation circuit 14 is coupled to receive a reference voltage for circuit 14. Preferably, the voltage at input 32 is a fixed precision voltage that does not vary. However, in some embodiments, the voltage on input 32 may vary. Circuit 14 is also formed to responsively receive the value of the voltage on return 18 on a first signal input 34 that is coupled to return 18, and is formed to responsively receive the value of the voltage on remote return 21 on a second signal input 33 that is coupled to remote sense input 25. Reference inputs 31 and 32 provide reference voltages for the signals applied to signal inputs 33 and 34, thus, circuit 14 adjusts or translates the value of the voltage on output 16 to directly follow voltage variations at input 33 relative to the value on output 15, and to directly follow the voltage variations at input 34 relative to the internal voltage (VI) on input 32. As will be seen hereinafter, the magnitude of the adjustment or translation depends on desired gains within circuit 14. As the value of any of the voltages applied to inputs 31, 32, or 34 vary, circuit 14 translates this voltage variation to output 16 and also to output 15 through the feedback connection of resistor 54.

In one embodiment, circuit 14 utilizes an amplifier 53, generally illustrated by a dashed box, that is formed to adjust or translate the value on output 15 to simultaneously include variations in the value of the voltage on voltage node 17 and to include variations in the difference or delta between the values of the voltage on power return 18 and remote return 21. In other embodiments, translation circuit 14 may have a different embodiment as long as it is formed to implement the functions of amplifier 53. As will be seen hereinafter, amplifier 53 includes two differential stacks each having a reference input and a signal input. The signal inputs are formed as part of a current mirror transistor pair that is a load to a differential transistor pair. Another pair of transistors buffer the differential transistor pair and also receive the reference input values. One embodiment of circuit 14 also includes a buffer circuit 70 that reduces the loading on amplifier 53. Buffer circuit 70 includes a DAC output transistor 44, a darlington transistor 47, a buffer current source 59, and a compensation network 46. Buffer circuit 70, network 46, and darlington transistor 47 are generally illustrated by dashed boxes. Other embodiments of DAC 12 may use a different configuration for buffer circuit 70.

Amplifier 53 includes a first transistor 37 having a control electrode coupled to input 31 through a resistor 61, a first current carrying electrode coupled to power return 18, and a second current carrying electrode coupled to internal voltage node 17 through a first current source 56. A second transistor 38 of amplifier 53 has a first current carrying electrode responsively coupled to receive the voltage on remote return 21 via signal input 33. A resistor 68 is coupled in series between input 33 and transistor 38. A third transistor 39 of amplifier 53 has a control electrode connected to voltage reference input 32, a first carrying electrode connected to power return 18, and a second carrying electrode coupled to internal voltage node 17 through a second current source 57. Transistor 39 is a level shifter for the voltage applied on input 32. Transistor 37 balances the other leg of the differential amplifier to match transistor 39 and provides symmetrical inputs. The reference voltage formed at input 32 may be formed from various sources as long as the voltage is precise, preferably at least ninety-nine percent (99%) accurate. In one embodiment, the reference voltage is derived from the internal voltage (VI) at node 17 by a voltage divider comprising resistors 51 and 52. In another embodiment, the reference voltage is provided directly by voltage regulator 24 which has an output connected to input 32. Divider 36 includes a resistor 52 coupled between node 17 and input 32, and a resistor 51 coupled between input 32 and power return 18. In other embodiments, a different circuit may be used for divider 36. A fourth transistor 41 of amplifier 53 has a first current carrying electrode responsively coupled to receive the voltage value on power return 18 through a connection to internal signal input 34, a control electrode coupled to a control electrode of second transistor 38, and a second current carrying electrode coupled to a control electrode of DAC output transistor 44 via a connection to an amplifier output 30. A resistor 66 is coupled in series between input 34 and transistor 41. A fifth transistor 42 of amplifier 53 as a control electrode connected to the second current carrying electrode of transistor 39, a first current carrying electrode connected to the second current carrying electrode of transistor 41, and a second current carrying electrode coupled to internal voltage node 17 through a resistor 64 and a third current source 58. Amplifier 53 has a sixth transistor 43 with a control electrode connected to the second current carrying electrode of transistor 37, a first current carrying electrode connected to a second current carrying electrode of transistor 38, and a second current carrying electrode coupled to internal voltage node 17 through a resistor 63 and third current source 58. Current sources 56, 57, 58, and 59 are formed as constant current sources that supply an approximately constant current. In one embodiment, source 56 and 57 supply a current of approximately five (5) micro-amps and sources 58 and 59 supply approximately seventy-five (75) micro-amps.

DAC output transistor 44 has a first current carrying electrode connected to internal voltage node 17 and a second current carrying electrode connected to output 16. Compensation network 46 typically is inserted in series between output 30 and the control electrode of transistor 44 in order to provide stability and slew rate control on output 16. Buffer current source 59 is connected between node 17 and compensation network 46 to provide a controlled ramp charging characteristic for network 46. In this embodiment, network 46 includes a capacitor 71 in series with a resistor 72 to limit the slew rate and provide stability for DAC 12. Darlington transistor 47 of circuit 14 is coupled to provide increased drive to transistor 44 and reduce the loading on amplifier 53. Transistor 47 has a control electrode connected to output 30, a first current carrying electrode coupled to the control electrode of transistor 44, and a second current carrying electrode coupled to return 18. The reduced loading assists in maintaining matching between the differential sections of amplifier 53.

A transistor 76 and a resistor 77 form a buffer that reduces offset error and minimizes early effect in transistors 38 and 41. Transistor 76 has a control electrode connected to the second current carrying electrode of transistor 38, a first current carrying electrode coupled to return 18 through resistor 77, and a second current carrying electrode connected to node 17.

In operation, network 13 receives the digital value of the digital input signal applied to inputs 20 and converts the digital value into a first current value. The current flows through resistor 54 to produce a first voltage value at output 15 and a corresponding voltage at DAC output 16. The following description refers to changes in return offsets or ground offsets and power supply offsets or power supply variations, and assumes that the first value formed by network 13 remains constant.

Referring to amplifier 53, transistors 43 and 42 are coupled to form a differential input pair and transistors 38 and 41 are coupled to form a current mirror that is a load for transistors 43 and 42, respectively. Transistors 37 and 39 are coupled to provide level shifting for the voltages applied to inputs 31 and 32.

The voltages of power return 18 and remote return 21 are respectively applied to signal inputs 34 and 33 of amplifier 53. When the voltages of power return 18 and remote return 21 are equal, the currents in resistors 63 and 64 are equal, the currents in resistors 68 and 66 are equal, and the currents in resistors 63 and 64 equal the currents in resistors 68 and 66, respectively. When there is a difference in the voltage potential between returns 18 and 21, reflected in the voltages at inputs 34 and 33, respectively, or a power return offset or return offset (often referred to as a ground offset or delta), the value of the return offset will be applied across resistor 66. Initially, this voltage difference will cause a corresponding change in the current through resistor 66 and transistor 41. The voltage change across resistor 66 forms a corresponding voltage change at output 30 that approximately equals the value of the return offset. The voltage change on output 30 is applied to transistor 47 which applies the change to the control electrode of transistor 44. Transistor 44 responsively varies which causes a corresponding variance in the voltage applied to output 16. As the voltage on output 16 changes, the voltage at output 15 is also forced to change by the same amount resulting in a corresponding change at output 15, at input 31, and at the control electrode of transistor 37. The voltage change is reflected across transistors 37 and 43 forcing a corresponding change in the voltage across resistor 63 and a change in the current through resistor 63. Since current source 58 is a constant current source, the change in current through resistor 63 is reflected as an opposite change in current through resistor 64. The difference in current through the two legs of amplifier 53 and the change in the voltage at output 16 remains as long as the return offset remains. Consequently, translation circuit 14 has adjusted the value of output 16 correspondingly to the return offset reflected as the difference in voltage between the values on inputs 33 and 34. As a result, the voltage seen at input 40 (See FIG. 1) relative to the voltage at remote return 21 represents the desired voltage representing the code applied to inputs 20 because the voltage value at DAC output 16 has been translated by an amount equal to the return offset voltage between remote return 21 and return 18.

Similarly, the value of the internal voltage (VI) value at node 17 may also vary. Such a power source variation value or power source offset is applied as a voltage change at input 32 relative to the value at input 34. This voltage change is reflected as a corresponding change in voltage across resistor 64. Similarly to the operation resulting from the change in the return offset, the power source variation changes the voltage at output 16 and output 15 which eventually changes the currents through resistors 63 and 64 and the corresponding legs of amplifier 53. Thus, DAC 12 changes the value at DAC output 16 and at output 15 of network 13 by an amount approximately equal to the value of the power source variation. Accordingly, if there is both a return offset and a power source offset, circuit 14 simultaneously adjusts or translates the value of the voltage on DAC output 16 and at output 15 responsively to the combined offset values. It can be thought of that circuit 14 is formed to add either of or both of the power source offset value and the power return offset value to the first value formed at output 15.

The value of resistors 63 and 64 preferably are equal and the value of resistors 68 and 66 preferably are equal to ensure the currents through amplifier 53 are balanced. Additionally, the ratio of the value of resistors 63 and 64 to resistors 68 and 66 set the gain of amplifier 53. Preferably, resistors 63, 64, 66, and 68 are equal, and amplifier 53 has a gain of approximately one. The values of resistors 63, 64, 66, and 68 typically match to a tolerance of no less than ninety-nine per cent (99%) and assist in forming DAC 12 to have an error of less than approximately 0.1 percent (0.1%). In one embodiment, transistors 37, 38, 39, 41, 42, 43, 44, 47, and 76 are all bipolar transistors. In other embodiments they may be Bipolar, MOS, BiCMOS, or combinations thereof. Preferably, transistors 37, 39, 42, and 43 are PNP transistors to facilitate operation when the internal voltage (VI) typically is no greater than about 3.0 volts, and transistors 38, 41, 44, 47, and 76 are NPN transistors. It should be noted that the maximum allowable return difference must be less than the value of the current provided by current source 58 times the value of either of resistor pair 63 plus 68 or resistor pair 64 plus 66.

Figure 3:
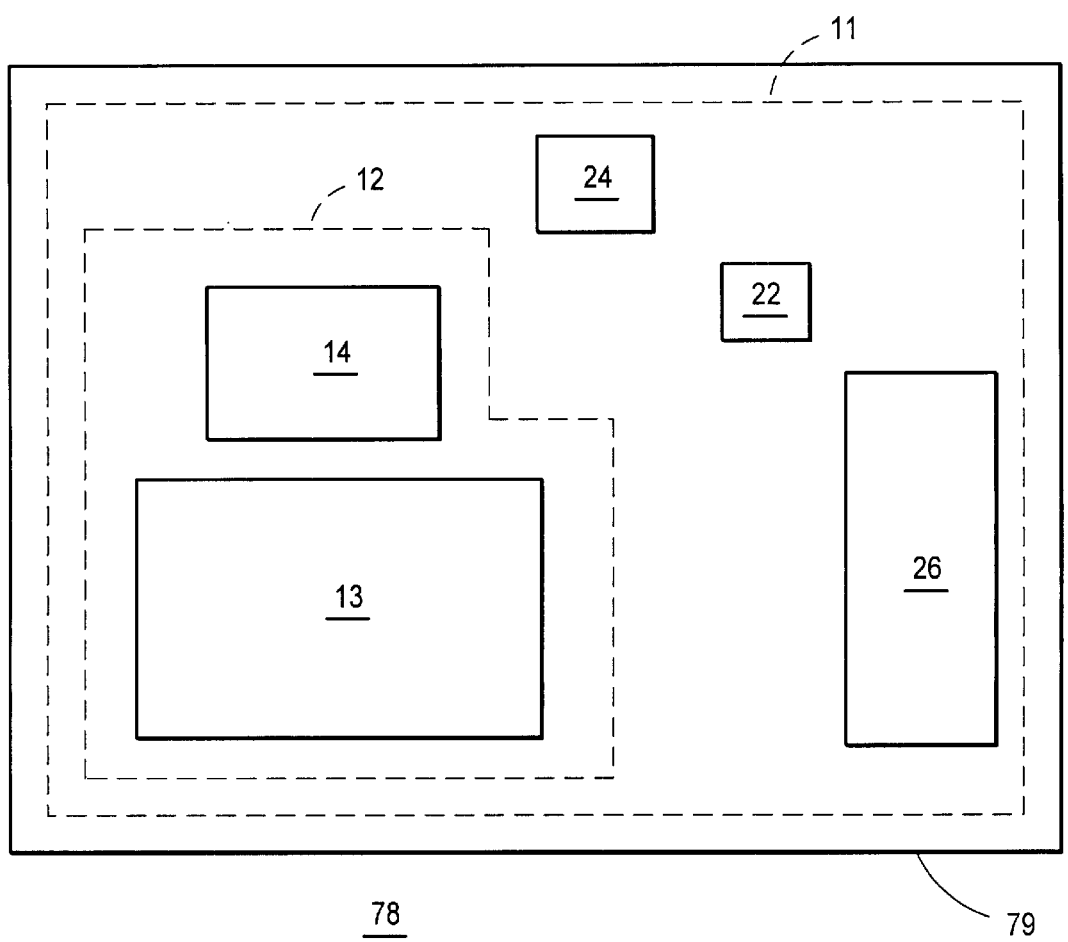
FIG. 3 schematically illustrates an enlarged plan view of a semiconductor device.

FIG. 3 schematically illustrates an enlarged plan view of a semiconductor device 78 that includes DAC 12 and circuit 11 formed on a semiconductor die 79.

In the prior art, it is against the prior art teachings to add an error voltage in the DAC output, thus, the output of a DAC would not be modified because a very precise output was desired. It was thought that modifying the value of the DAC output could result in a non-precise output, thus, it is against the teachings to add an error voltage to the output of a precision DAC. However, by now it should be appreciated that an unexpected advantage has been provided herein from adding an error voltage by modifying or translating the value formed at DAC output 16 to form a more precise value at the point where the DAC output value is used. Thus, this unexpected result advantageously provides a method of forming a semiconductor system having a semiconductor device that includes a DAC. Translating the DAC output to include the value of variations between the power return and the remote return advantageously increases the accuracy over techniques that merely connect the two returns to an external common point. DAC 12 often is formed on a semiconductor die with circuit 11. Adding the error voltage to DAC output 16 reduces the number of amplifiers on the semiconductor die thereby reducing the cost in addition to improving the accuracy.

While the invention is described with specific embodiments, it is evident that many alternatives and variations will be apparent to those skilled in the semiconductor arts. More specifically the invention has been described for a particular PNP and NPN transistor structure, although the method is directly applicable to other bipolar transistors, as well as to MOS, BiCMOS, metal semiconductor FETs (MESFETs), HFETs, and other transistor structures.

What is claimed is:

1. A method of forming a semiconductor device comprising:
    forming a digital-to-analog converter circuit of the semiconductor device to include a digital-to-analog conversion network coupled to convert a digital input into an analog signal having a first value at an output of the digital-to-analog conversion network;
    forming a translation circuit coupled to translate the first value to a second value that includes a power return offset value; and
    coupling the translation circuit to apply the second value to the output of the digital-to-analog conversion network.

2. The method of claim 1 wherein forming the translation circuit coupled to translate the first value to the second value includes coupling the translation circuit to add the power return offset value to the first value at the output of the digital-to-analog conversion network.

3. The method of claim 2 wherein coupling the translation circuit to add the power return offset value includes coupling the translation circuit to use a voltage difference between an internal power return and a remote power return.

4. The method of claim 1 wherein forming the translation circuit coupled to translate the first value to the second value includes coupling the translation circuit responsively to a power source voltage and a remote power return.

5. A method of forming a semiconductor device comprising:
   forming a digital-to-analog converter circuit of the semiconductor device to include a digital-to-analog conversion network coupled to convert a digital input into an analog signal having a first value at an output of the digital-to-analog conversion network; and
   forming an amplifier coupled to adjust the first value to a second value that includes a return offset value and forming the amplifier to generate the second value at an output of the digital-to-analog converter circuit and at the output of the digital-to-analog conversion network.

6. The method of claim 5 wherein forming the amplifier coupled to adjust the first value to the second value that includes the return offset value includes using a voltage representative of an internal power source as a reference voltage of the amplifier.

7. The method of claim 5 wherein forming the amplifier coupled to adjust the first value to the second value that includes the return offset value includes using a ground offset value as a signal input to the amplifier.

8. A semiconductor device structure comprising:
   a digital-to-analog converter circuit having a first output;
   a digital-to-analog conversion network of the digital-to-analog converter circuit, the digital-to-analog conversion network having a second output formed to generate a first voltage;
   an amplifier of the digital-to-analog converter circuit, the amplifier having a first reference input responsively coupled to the second output and having an amplifier output coupled to generate a second voltage on the first output and on the second output; and
   a first signal input of the amplifier, the first signal input coupled to receive a remote ground voltage.

9. The semiconductor device structure of claim 8 wherein the amplifier further includes:
   an internal ground node;
   an internal voltage node;
   a second signal input coupled to the internal ground node;
   a first transistor having a first control electrode coupled to the second output, a first current carrying electrode coupled to the internal ground node, and a second current carrying electrode coupled to receive a first current source;
   a reference circuit responsively coupled to the internal voltage node to generate a second reference voltage on a second reference input;
   a second transistor having a first current carrying electrode coupled to the second signal input, a second current carrying electrode coupled to receive a current responsive to the second reference input, and a control electrode;
   a third transistor having a control electrode coupled to receive the second reference voltage, a first current carrying electrode coupled to the internal ground node, and a second current carrying electrode coupled to receive a second current source; and
   a fourth transistor having a first current carrying electrode coupled to the first signal input, a control electrode coupled to the control electrode of the second transistor, and a second current carrying electrode coupled to receive a current responsive to the first reference input.

10. The semiconductor device structure of claim 9 further including:
    a fifth transistor having a first current carrying electrode coupled to the second current carrying electrode of the second transistor, a control electrode coupled to the second current carrying electrode of the third transistor, and a second current carrying electrode coupled to a receive a third current source; and
    a sixth transistor having a first current carrying electrode coupled to the second current carrying electrode of the fourth transistor, a control electrode coupled to the second current carrying electrode of the first transistor, and a second current carrying electrode coupled to a receive the third current source.

11. The semiconductor device structure of claim 10 further including a seventh transistor having a control electrode coupled to the second current carrying electrode of the second transistor, a first current carrying electrode coupled to the internal voltage node, and a second current carrying electrode coupled to the first output.

12. The semiconductor device structure of claim 11 further including an eighth transistor having a control electrode coupled to the second current carrying electrode of the second transistor, a first current carrying electrode coupled to the control electrode of the seventh transistor, and a second current carrying electrode coupled to the first output.

13. The semiconductor device structure of claim 10 further including a seventh transistor having a control electrode coupled to the second current carrying electrode of the fourth transistor, a first current carrying electrode coupled to the internal voltage node, and a second current carrying electrode coupled to the internal ground node through a resistor.

14. The semiconductor device structure of claim 9 wherein the second current carrying electrode of the second transistor is coupled to generate the second voltage on the first output.

15. The semiconductor device structure of claim 9 further including a fifth transistor having a control electrode coupled to the second current carrying electrode of the second transistor, a first current carrying electrode coupled to the internal voltage node, and a second current carrying electrode coupled to the first output.

16. The semiconductor device structure of claim 8 wherein the second voltage simultaneously includes a power source variation value and a power return offset value.

17. The semiconductor device structure of claim 8 further including the amplifier having a second reference input responsively coupled to receive a reference voltage from a power source.

18. The semiconductor device structure of claim 8 further including the amplifier having a second signal input coupled to an internal ground node.

19. The semiconductor device structure of claim 8 further including the amplifier having a second signal input coupled to receive an internal ground voltage of the digital-to-analog converter circuit.

20. The semiconductor device structure of claim 8 wherein the amplifier has an error no greater than 0.1 percent (0.1%).

* * * * *